United States Patent
Ponnekanti

(10) Patent No.: US 10,854,432 B2
(45) Date of Patent: Dec. 1, 2020

(54) ROTARY PLASMA ELECTRICAL FEEDTHROUGH

(71) Applicant: Applied Materials, Inc., Santa Clara, CA (US)

(72) Inventor: Hari K. Ponnekanti, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 262 days.

(21) Appl. No.: 15/614,794

(22) Filed: Jun. 6, 2017

(65) Prior Publication Data

US 2017/0352558 A1    Dec. 7, 2017

Related U.S. Application Data

(60) Provisional application No. 62/346,970, filed on Jun. 7, 2016.

(51) Int. Cl.
H01J 37/32    (2006.01)

(52) U.S. Cl.
CPC .. H01J 37/32568 (2013.01); H01J 37/32009 (2013.01)

(58) Field of Classification Search
USPC ................................. 118/723 R; 156/345.55
See application file for complete search history.

(56) References Cited

U.S. PATENT DOCUMENTS

| | | | |
|---|---|---|---|
| 3,514,553 A | 5/1970 | Penney, Jr. et al. | |
| 5,110,437 A * | 5/1992 | Yamada | H01J 37/32082 118/723 E |
| 5,704,792 A | 1/1998 | Sobhani | |
| 2003/0129857 A1 | 7/2003 | Welch | |
| 2005/0126497 A1 * | 6/2005 | Kidd | C23C 14/505 118/730 |
| 2009/0060137 A1 * | 3/2009 | Fritzler | H01J 35/065 378/114 |
| 2014/0197136 A1 * | 7/2014 | Nagorny | H05H 1/46 216/68 |
| 2017/0236693 A1 | 8/2017 | Kobayashi et al. | |

FOREIGN PATENT DOCUMENTS

| | | | | |
|---|---|---|---|---|
| JP | 11279764 | * | 10/1999 | ............. C23C 16/44 |
| JP | 2000178741 A | * | 6/2000 | |

* cited by examiner

*Primary Examiner* — Ram N Kackar
(74) *Attorney, Agent, or Firm* — Patterson + Sheridan, LLP

(57) ABSTRACT

The present disclosure generally relates to methods and apparatus for facilitating electrical feedthrough in plasma processing chambers. The apparatus includes an electrically insulating housing positioned on a backside of the substrate support to contain a secondary plasma therein. The secondary plasma facilitates an electrical connection between the substrate support and electrical power or ground located outside the processing chamber. The methods include utilizing a secondary plasma to electrically couple substrate support to and electrical power or ground located outside the processing chamber.

18 Claims, 2 Drawing Sheets

ROTARY PLASMA ELECTRICAL FEEDTHROUGH

CROSS-REFERENCE TO RELATED APPLICATIONS

This application claims benefit of U.S. Provisional Patent Application Ser. No. 62/346,970, filed Jun. 7, 2016, which is herein incorporated by reference.

BACKGROUND

Field

Aspects of the present disclosure generally relate to plasma processing chambers, and more particularly, for electrical feedthrough designs for the generation of a plasma in a processing chamber.

Description of the Related Art

In the processing of a substrate, e.g., a semiconductor substrate or a glass panel such as one used in flat panel display manufacturing, plasma is often employed to deposit or etch one or more layers formed on a substrate. To form a plasma within a processing chamber, one or more gases are introduced to a process region of a processing chamber, and power (e.g., RF or DC) is applied to the one or more gases to ionize the one or more gases. Current or power is applied to an upper electrode, such as a showerhead, and travels through the plasma to a lower electrode, such as a substrate support. From the lower electrode or substrate support, the current or power is returned to ground, or in the case of RF power, to the source.

However, issues exist with transferring current or power from the lower electrode to the ground or source. For example, if the substrate support is movable, electrical connections to transfer power from the substrate support may be difficult to maintain, or may wear out easily, such as when using brush contacts. In such a case, charge may accumulate at the substrate support, resulting in uneven processing, plasma non-uniformity, or arcing.

Therefore, there is a need for an electrical feedthrough in rotary plasma chambers.

SUMMARY

In one aspect, a processing chamber comprises a chamber body, an upper electrode disposed on the chamber body, a substrate support, a circular electrode coupled to a backside of the substrate support, an electrically insulating housing positioned adjacent backside of the substrate support between the substrate support and the chamber body, and an electrical contact positioned at a first end of the electrically insulating housing opposite the circular electrode.

In another aspect, a processing chamber, comprises a chamber body having one or more walls, an upper electrode disposed on the chamber body, a substrate support disposed between the upper electrode and a first wall of the one or more walls of the chamber body, a circular electrode disposed on a side of the substrate support, an electrically insulating housing positioned adjacent to the side of the substrate support, and between the substrate support and the first wall, and a coupling electrode positioned at a first end of the electrically insulating housing opposite the circular electrode.

In another aspect, a method comprises generating a first plasma within a process region of a processing chamber, the processing region located between an upper electrode and an upper surface of a substrate support, and generating a second plasma between a lower surface of the substrate support and the chamber body, the second plasma electrically connecting the upper electrode to electrical power or ground located outside the processing chamber.

In another aspect, a method of generating a plasma in a processing chamber, comprises biasing an upper electrode relative to a coupling electrode, wherein a substrate support is disposed between the upper electrode and the coupling electrode, and wherein an electrical current, which is generated when the upper electrode is biased relative to the coupling electrode, flows through a circular electrode disposed on a side of the substrate support as the substrate support is rotated about an axis.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, and the disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure generally relates to methods and apparatus for facilitating electrical feedthrough in plasma processing chambers. The apparatus includes an electrically insulating housing positioned on a backside of the substrate support to contain a secondary plasma therein. The secondary plasma facilitates an electrical connection between the substrate support and electrical power or ground located outside the processing chamber. The methods include utilizing a secondary plasma to electrically couple a substrate support to an electrical power or ground located outside the processing chamber.

Figure 1A:
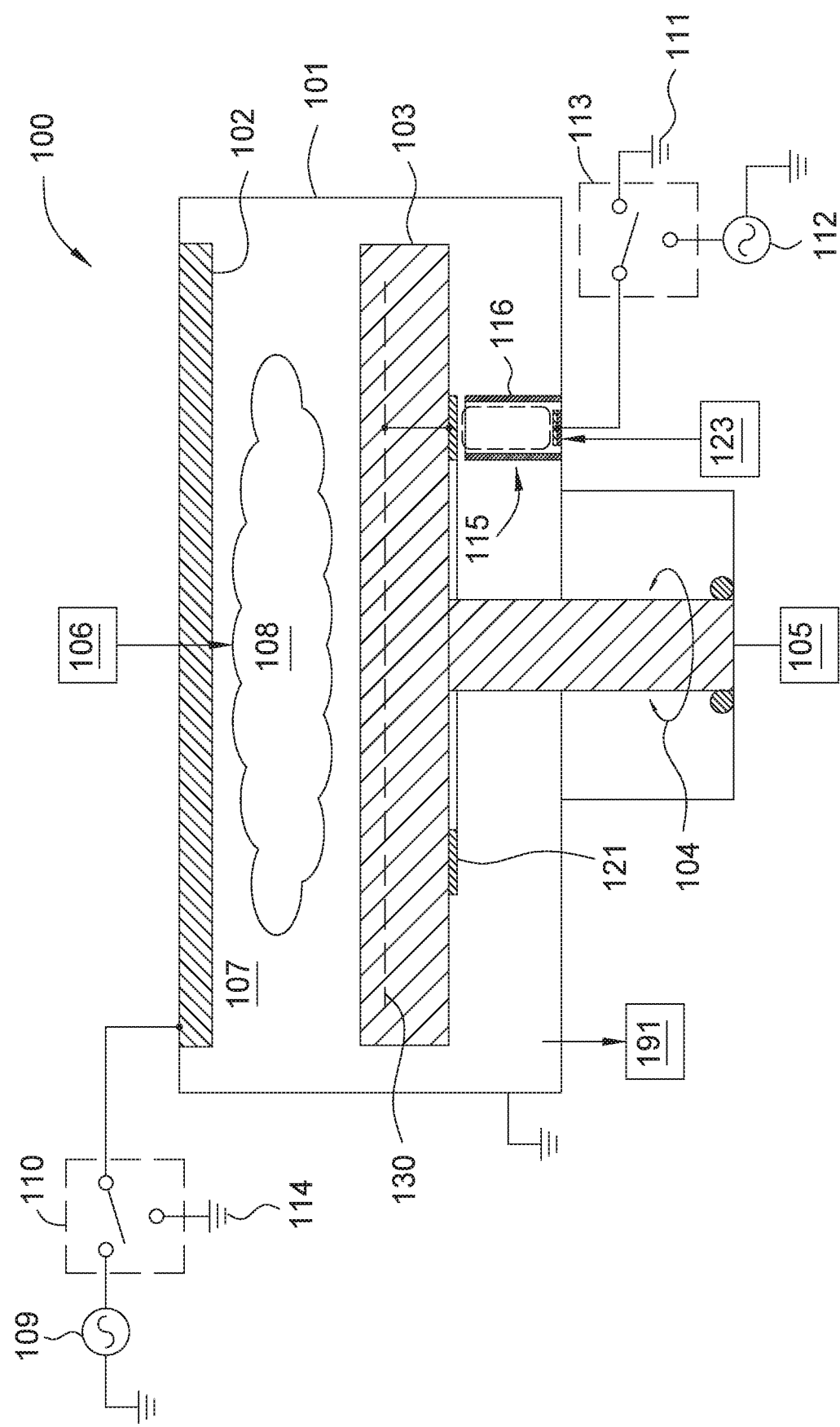
FIG. 1A is a schematic sectional view of a processing chamber, according to one aspect of the disclosure.

FIG. 1A is a schematic sectional view of a processing chamber 100, according to one aspect of the disclosure. The processing chamber 100 includes a chamber body 101. The chamber body 101 may be formed from a metal such as aluminum, aluminum alloys, or stainless steel. An upper electrode 102, such as a showerhead, is disposed in the upper portion of the chamber body 101. The upper electrode 102 may be formed from a metal, such as aluminum or an aluminum alloy. A substrate support 103 is positioned in a lower portion of the chamber body 101 opposite the upper electrode 102. The substrate support 103 is rotatable about a central axis as shown by arrow 104. An actuator 105 facilitates rotation of the substrate support 103. The substrate support 103 includes an electrode 130 embedded therein to facilitate plasma generation of, or processing with, a primary plasma 108 within the processing chamber 100. The substrate support 103 may be formed from a material such as aluminum nitride, silicon carbide or silicon nitride, and the electrode 130 may be formed form an electrically conductive material, such as tungsten, molybdenum, or cobalt.

A first process gas source 106 is positioned to introduce process gas into a processing region 107 defined between the upper electrode 102 and an upper surface of the substrate support 103. During processing the processing region 107 is typically evacuated by use of a pump 191 to achieve a pressure below atmospheric pressure. The process gas provided from the first gas source 106 may be ignited into the primary plasma 108 to facilitate processing of substrates within processing chamber 100. In one example, the process gas provided from the first process gas source 106 may be a deposition precursor or an etchant gas. A first power source 109 may provide power through a first switch 110 to the upper electrode 102 to facilitate generation of the primary plasma 108. In some aspects, the power applied from the first power source 109 is removed from the system via a ground 111 that is coupled to a coupling electrode 118 (see FIG. 1B). Alternatively, power may be applied to the processing chamber 100 via a second power source 112 that is coupled to the coupling electrode 118. In such an example, power flows through a second switch 113, and is ultimately removed from the processing chamber 100 via a ground 114. Each of the switches 110, 113 may be coupled to a respective power source 109, 112 or respective ground 114, 111. Thus, it is to be noted that the first and second switches 110, 113 may be adjusted to determine the direction of current flow through the processing chamber 100.

The processing chamber 100 also includes a backside plasma apparatus 115. The backside plasma apparatus 115 facilitates plasma generation and/or plasma containment at the backside of the substrate support 103. The backside plasma apparatus 115 facilitates an electrical connection between the substrate support 103 (or an electrode 130 embedded therein) and the ground 111 or second power source 112. Thus, the backside plasma apparatus 115 completes an electrical connection between the first power source 109 and the ground 111, or between the second power source 112 and the ground 114.

Figure 1B:
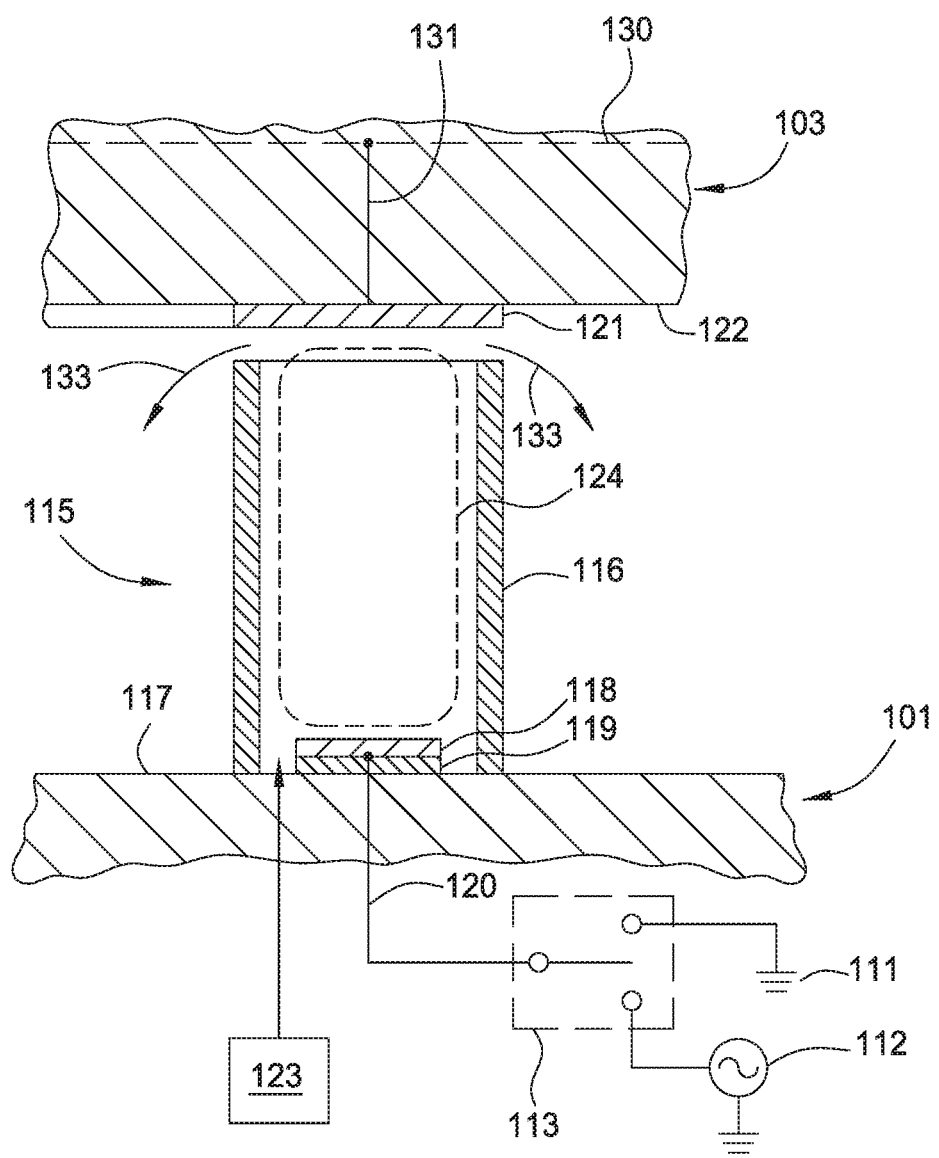
FIG. 1B is schematic enlarged partial view of the processing chamber of FIG. 1A.

FIG. 1B is schematic enlarged partial view of the processing chamber 100 of FIG. 1A, and in particular, an enlarged schematic view of the backside plasma apparatus 115. The backside plasma apparatus 115 includes a housing 116 for containing a plasma therein. In one example, the housing 116 is a hollow cylinder of electrically insulating or dielectric material. For example, the housing 116 may be formed from alumina, silicon oxide, silicon nitride, or silicon carbide or other useful materials that can be exposed to a generated plasma. The housing 116 is positioned in contact with an upper surface 117 of a bottom wall of the chamber body 101. A coupling electrode 118 is positioned within the housing 116 to facilitate plasma generation therein to electrically couple the coupling electrode 118 to a circular electrode 121 during processing, as discussed further below. In one example, the circular electrode 121 is a ring. The coupling electrode 118 may be formed from an electrically conductive material, such as a metal, for example tungsten, stainless steel or aluminum. The coupling electrode 118 is electrically isolated from the chamber body by an insert 119, which may be formed from an electrically insulating or dielectric material, such as alumina, silicon oxide, silicon nitride, or silicon carbide. The coupling electrode 118 is electrically coupled to the second switch 113, and thus to either the ground 111 or the second power source 112 via a connection 120. Although not shown, it is contemplated that the connection 120 may be electrically insulated from the chamber body 101, for example, by an electrically insulating sleeve disposed therearound.

A circular electrode 121 is coupled to a backside 122 of the substrate support 103. The circular electrode 121 is electrically coupled to the electrode 130 by an electrical connector 131. In one example, the electrical connector 131 is an electrically conductive wire that couples the circular electrode 121 to the electrode 130. The circular electrode 121 is sized and positioned such that the circular electrode 121 remains positioned over the housing 116 during rotation of the substrate support 103. Stated otherwise, the radial distance of the housing 116 from the axis of rotation of the substrate support 103 is about equal to the radius of the circular electrode 121.

A second gas source 123 is configured to introduce a process gas to the interior of the housing 116 between the coupling electrode 118 and the circular electrode 121. As electric current flows through the processing chamber 100, a secondary (or backside) plasma 124 is generated within the housing 116. The secondary plasma 124 creates an electrical connection between the circular electrode 121 and the coupling electrode 118. It is to be noted that the secondary plasma 124 is contained within the housing 116, thus avoiding undesirable effects of backside plasmas which are not contained. For example, unwanted deposition, etching, and/or contamination are mitigated when using the backside plasma apparatus 115.

During operation, electrical power is provided from the first power source 109, through the first switch 110, and to the upper electrode 102. As process gas is introduced into the processing region 107 from the first gas source 106, the primary plasma 108 is generated. The primary plasma 108 is a capacitively coupled plasma generated across a "positively" biased electrode, e.g., the upper electrode 102, and a "negatively" biased electrode, e.g., the electrode 130 embedded in the substrate support 103. The electrical power provided by the first power source 109 travels across the primary plasma 108 to the electrode 130. The electrode 130 is electrically connected to the circular electrode 121 via an electrical connector 131. Thus, electrical power received at the electrode 130 is transferred to the circular electrode 121.

As discussed earlier, the coupling electrode 118, which is positioned opposite the circular electrode 121, can be electrically connected to ground 111. The oppositions of circular electrode 121 and 118 generate a capacitively coupled plasma, e.g., the secondary plasma 124, therebetween. The secondary plasma 124 allows electrical power provided from the first power source 109 to travel to the ground 111. Alternatively, the secondary plasma 124 may allow electrical power provided from the second power source 112 to travel to ground 114. Due to the circular shape of the circular electrode 121, the secondary plasma 124 remains ignited even as the substrate support 103 rotates, since at least a portion of the circular electrode 121 is positioned adjacent the coupling electrode 118 during rotation. Thus, power may be transferred from a rotating substrate support without the use of a physical contact, such as a brush contact, which may wear out or generate undesired contamination within the processing chamber 100.

It is to be noted that the above described current flow is only for explanation purposes, and it is to be understood current may flow in the reference direction depending on the positions of the switches 110, 113.

The secondary plasma 124 is generated by providing a process gas from the process gas source 123 to the interior of the housing 116, as shown by arrow 132. With gas present within the housing 116 and power being applied from either the first power source 109 or the second power source 112, the secondary plasma 124 ignites as the electric current flows within the processing chamber. Process gas escapes the housing 116 as shown by arrows 133. Process gas which exits the housing 116 is no longer located between the circular electrode 121 and the coupling electrode 118, and thus a plasma is not maintained outside of the housing 116. In such an aspect, undesired backside plasmas, e.g., plasmas outside the housing 116, are minimized or prevented. In some aspects, the pressure within interior region of the housing 116 is controlled by the flow of process gas from the process gas source 123. In some cases, the flow of process gas from the process gas source 123, and/or RF power, is increased or decreased to increase or decrease the plasma density within the interior region, and thus the electrical coupling between the coupling electrode 118 and the circular electrode 121.

FIGS. 1A and 1B illustrate one aspect of the disclosure; however, additional aspects are also contemplated. In another aspect, it is contemplated that multiple backside plasma apparatuses 115 may be positioned at intervals about the circular electrode 121. Multiple backside plasma apparatuses 115 may ensure that a desired electrical conductivity is maintained in the event a secondary plasma 124 is extinguished in one of the backside plasma apparatuses 115. Additionally or alternatively, multiple backside plasma apparatuses 115 may facilitate a desired current being achieved during processing. Moreover, multiple backside plasma apparatuses 115 may facilitate a uniform current flow through the circular electrode 121, and thus facilitating creation a uniform primary plasma 108 within the processing region 107 during plasma processing.

Benefits of the present disclosure include the avoidance of brush contacts or similar electrical connections for electrical feed through in plasma processing chambers that utilize rotating substrate supports. Because brush contacts or other physical contacts are not utilized, particle contamination is greatly reduced due to a reduction of moving physical components. Moreover, the mean time between preventative maintenance may be extended due to the exclusion of brush contacts or similar electrical connections.

While the foregoing is directed to aspects of the present disclosure, other and further aspects of the disclosure may be devised without departing from the basic scope thereof, and the scope thereof is determined by the claims that follow.

What is claimed is:

1. A method of processing a substrate in a processing chamber, comprising:
   positioning a substrate on a substrate support within the processing chamber, the substrate support disposed between an upper electrode and a coupling electrode of the processing chamber, the upper electrode facing the substrate support, the substrate support further comprising a circular electrode disposed on a side of the substrate support facing the electrode;
   biasing the upper electrode relative to the coupling electrode to generate an electrical current;
   flowing the electrical current through the circular electrode as the substrate support is rotated about an axis;
   generating a primary plasma between the upper electrode and the substrate support from a primary plasma gas; and
   generating a secondary plasma from a secondary plasma gas introduced into an electrically insulating housing between the coupling electrode and the circular electrode, an upper end of the electrically insulating housing spaced apart from the circular electrode, wherein the primary plasma and the secondary plasma are in series between the upper electrode and the coupling electrode.

2. The method of claim 1, wherein the circular electrode is coupled to a lower surface of the substrate support.

3. The method of claim 1, wherein the first plasma and the second plasma are generated simultaneously.

4. The method of claim 1, wherein the electrically insulating housing comprises alumina, silicon oxide, silicon nitride, or silicon carbide.

5. The method of claim 1, wherein the circular electrode is a ring.

6. The method of claim 1, wherein the electrically insulating housing is a hollow cylinder.

7. The method of claim 1, wherein a radial distance of the electrically insulating housing from an axis of rotation of the substrate support is about equal to the radius of the circular electrode.

8. The method of claim 1, wherein the circular electrode and the electrically insulating housing facilitate an electrical connection between the upper electrode and the coupling electrode.

9. The method of claim 1, wherein the primary plasma is generated in a process region of the processing chamber.

10. The method of claim 9, wherein the process region is maintained at a pressure below atmospheric pressure.

11. The method of claim 1, wherein a power is applied to the processing chamber via a power source coupled to the upper electrode.

12. The method of claim 11, wherein the power is removed from the processing chamber via a ground coupled to the coupling electrode.

13. The method of claim 1, wherein an electrical current is flowed from the upper electrode to the coupling electrode.

14. The method of claim 1, wherein a power is applied to the processing chamber via a power source coupled to the coupling electrode.

15. The method of claim 14, wherein the power is removed from the processing chamber via a ground coupled to the upper electrode.

16. The method of claim 1, wherein an electrical current is flowed form the coupling electrode to the upper electrode.

17. The method of claim 1, wherein a direction of electrical current flow between the upper electrode and the coupling electrode is adjusted via one or more switches coupled to the processing chamber.

18. The method of claim 1, wherein secondary plasma gas is flowed out of the electrically insulating housing via a gap defined between an upper end of the electrically insulating housing and the substrate support.

* * * * *